United States Patent
Henley

(10) Patent No.: US 6,526,997 B1
(45) Date of Patent: Mar. 4, 2003

(54) DRY CLEANING METHOD FOR THE MANUFACTURE OF INTEGRATED CIRCUITS

(76) Inventor: Francois J. Henley, 525 Shadowmere Way, Aptos, CA (US) 95003

(*) Notice: Subject to any disclaimer, the term of this patent is extended or adjusted under 35 U.S.C. 154(b) by 0 days.

(21) Appl. No.: 09/642,284

(22) Filed: Aug. 18, 2000

(51) Int. Cl.⁷ ................................................. C25F 5/00
(52) U.S. Cl. ................... 134/1.3; 134/21; 134/25.4; 134/26; 134/30; 134/37; 134/902; 438/906; 15/1.51
(58) Field of Search .................. 134/1.3, 2, 21, 134/25.4, 26, 30, 37, 902; 15/1.51; 438/906

(56) References Cited

U.S. PATENT DOCUMENTS

| | | | |
|---|---|---|---|
| 4,744,833 A | 5/1988 | Cooper et al. ................ 134/1 |
| 5,024,968 A | 6/1991 | Engelsberg ................ 437/173 |
| 5,099,557 A | 3/1992 | Engelsberg ................ 29/25.01 |
| 5,125,124 A | 6/1992 | Saeki et al. ................ 15/1.51 |
| 5,228,206 A | 7/1993 | Grant et al. ................ 34/1 |
| 5,584,938 A | 12/1996 | Douglas ................ 134/1.3 |
| 5,858,108 A * | 1/1999 | Hwang ................ 134/1.3 |
| 5,891,256 A | 4/1999 | Mohindra et al. ................ 134/2 |

FOREIGN PATENT DOCUMENTS

EP 0790642 A2 * 8/1997 ......... H01L/21/306

OTHER PUBLICATIONS

A. Grill.Cold Plasma in Materials Fabrication. 1994. IEEE PRESS. ISBN 0–7803–1055–1. pp. 110–111.*

Audrey C. Engelsberg, "Laser–Assisted Cleaning Proves Promising", Precision Cleaning Magazine, May 1995.

James F. Weygand et al., "Cleaning Silicon Wafers with an Argon/Nitrogen Cryogenic Aerosol Process", Micro, Apr. 1997.

* cited by examiner

*Primary Examiner*—Randy Gulakowski
*Assistant Examiner*—M. Kornakov
(74) *Attorney, Agent, or Firm*—Townsend and Townsend and Crew

(57) ABSTRACT

A method for manufacturing an integrated circuit device. The method includes retrieving an in process substrate comprising one or more particles from an input chamber, which is coupled to a chamber for a robot arm, which is maintained under a predetermined environment. The method moves the substrate from the input chamber into a cleaning chamber, which is coupled to the robot arm chamber. The method places the substrate onto a susceptor in the cleaning chamber; and applies a high energy photon from a high energy photon source onto a surface of a substrate to release the one or more particles from the surface of the substrate while the substrate is maintained in the predetermined environment. The method also applies an electrostatic force from an electrode directed to the substrate to attract the released one or more particles from the substrate to remove the one or more particles from the surface of the substrate, where upon the electrostatic force prevents a possibility of the one or more particles from redistributing back onto the surface of the substrate.

20 Claims, 9 Drawing Sheets

DRY CLEANING METHOD FOR THE MANUFACTURE OF INTEGRATED CIRCUITS

CROSS REFERENCES TO RELATED APPLICATIONS

The following three applications are being filed on the same date, where one is this application, and the others are related. The related applications are hereby incorporated by reference for all purposes:

U.S. Ser. No. 09/642 460 in the name of Francois J. Henley, and titled An Improved Dry Cleaning Method;

U.S. Ser. No. 09/642 264 in the name of Francois J. Henley and titled An Improved Dry Cleaning System and Computer Code; and U.S. Ser. No. 09/642 284 in the name of Francois J. Henley and titled An Improved Dry Cleaning Method for the Manufacture of Integrated Circuits

BACKGROUND OF THE INVENTION

The present invention relates to techniques for cleaning objects. More particularly, the invention provides a technique including a method for cleaning semiconductor devices using a combination of a high energy light source and electrostatic bias for removing impurities, such as particles and the like from integrated circuits, for example. But it will be recognized that the invention has a wider range of applicability; it can also be applied to other devices such as three-dimensional packaging of integrated semiconductor devices, photonic devices, opto-electronic devices, piezoelectronic devices, microelectromechanical systems ("MEMS"), sensors, actuators, solar cells, flat panel displays (e.g., LCD, AMLCD), biological and biomedical devices, and the like.

As integrated circuit device sizes become smaller, it is more desirable to remove particulate contamination from surfaces of such devices. Many techniques have been proposed or used to remove such particulate contamination. In the early days, such techniques have been limited to wet processing methods. These wet processing methods include a cascade rinse. The cascade rinse often utilizes a cascade rinser which includes inner and outer chambers, each separated by a partition. Rinse water flows from a water source into the inner chamber. The rinse water from the inner chamber cascades into the outer chamber. An in-process wafer such as an etched wafer is typically rinsed in the cascade rinser by dipping the etched wafer into the rinse water of the inner chamber. This process is often used to neutralize and remove acid from the etched wafer, which often remains in the rinse chamber to create particulate contamination problems.

Another technique often used to rinse wafers is the "quick dump" method. The quick dump method relies upon the rapid deployment of water from the rinse tank to remove water and impurities from the semiconductor wafer. A limitation with this method is its inability to actually clean or remove particles from the wafer. In fact, the rapid deployment of water from the tank often transfers more particles onto the wafer. In addition, the wafers from the quick dump tank must still undergo a drying operation, further increasing the number of particles on the wafer. As previously noted, more particles often relates to lower die yields on the semiconductor wafer.

A further technique used to both rinse and dry wafers relies upon a spin rinse/dryer. The spin rinse/dryer uses a combination of rinse water spray to rinse and centrifugal force to remove water from the semiconductor wafer. The dry step often removes the water from the semiconductor wafer substantially by centrifugal force and evaporation. However, the spin rinse/dryer often introduces more particles onto the wafer. In fact, initially dissolved or suspended contaminants such as particles in the water are often left on the semiconductor wafer, thereby reducing the number of good dies on the wafer. Another limitation with the spin rinse/dryer is its complex mechanical design with moving parts and the like. The complex mechanical design often leads to certain problems such as greater downtime, wafer breakage, more spare parts, greater costs, among others. A further limitation is static electricity often builds up on the wafers during the spin cycle, thereby attracting even more particles onto the surface of the semiconductor. Accordingly, the spin rinse/drying does not clean or remove particles from the wafer.

Other techniques used to dry wafers include an isopropyl alcohol (IPA) vapor dryer, full displacement IPA dryer, and others. These IPA-type dryers often rely upon a large quantity of a solvent such as isopropyl alcohol and other volatile organic liquids to facilitate drying of the semiconductor wafer. A limitation with this type of dryer is its use of the large solvent quantity, which is hot, highly flammable, and extremely hazardous to health and the environment.

Several dry techniques have also been used. For example, silicon wafers have been cleaned using an argon/nitrogen cryogenic aerosol process. Such dry technique has had many promising characteristics, but has had limited use in the manufacture of integrated circuits so far. Other techniques that have been proposed but still lack wide acceptance in the manufacture of integrated circuits. Such techniques often require the use of expensive equipment, chemicals, and the like. Additionally, such techniques have proved not to be significantly effective for cleaning silicon wafers.

From the above, it is seen that an improved method for cleaning objects is highly desirable.

SUMMARY OF THE INVENTION

According to the present invention, a technique including a method for manufacturing objects is provided. More particularly, the invention provides a technique including a method for cleaning objects using a combination of a high energy light source and electrostatic bias for removing impurities, such as particles and the like from integrated circuits, for example. But it will be recognized that the invention has a wider range of applicability; it can also be applied to other devices such as three-dimensional packaging of integrated semiconductor devices, photonic devices, opto-electronic devices, piezoelectronic devices, microelectromechanical systems ("MEMS"), sensors, actuators, solar cells, flat panel displays (e.g., LCD, AMLCD), biological and biomedical devices, and the like.

In a specific embodiment, the invention provides a method for manufacturing an integrated circuit device. The method includes retrieving an in process substrate comprising one or more particles from an input chamber, which is coupled to a chamber for a robot arm, which is maintained under a predetermined environment. The method moves the substrate from the input chamber into a cleaning chamber, which is coupled to the robot arm chamber. The method places the substrate onto a susceptor in the cleaning chamber; and applies a high energy photon from a high energy photon source onto a surface of a substrate to release the one or more particles from the surface of the substrate while the substrate is maintained in the predetermined environment. The method also applies an electrostatic force from an electrode directed to the substrate to attract the released one or more particles from the substrate to remove the one or more particles from the surface of the substrate, where upon the electrostatic force prevents a possibility of the one or more particles from redistributing back onto the surface of the substrate.

Numerous benefits are achieved over pre-existing techniques using the present invention. In a specific embodiment, the invention provides a clean and dry cleaning process, which is free from harmful chemicals, gases, and the like. In other embodiments, the invention permanently removes particles, which cannot reattach themselves to the substrate. The invention can be implemented using conventional hardware and software, with some customization. The method can be applied to the manufacture of many types of objects, e.g., integrated circuits, disks, opto-electronic devices. In other aspects, the invention is also cluster tool compatible, which can be used with other processes. The invention can also be applied after a variety of integrated circuit device manufacturing processes, e.g., etching, pre-gate oxide formation, deposition, plating. The invention also provides a non-contact, dry, technique for removing a particle. In other aspects, the invention also prevents particles from reattaching onto surfaces of the object being processed. The invention is also clustertool compatible. Depending upon the application, one or more of these advantages may exist, but do not need to all exist to carry out the claims herein.

The present invention achieves these benefits and others in the context of known process technology. However, a further understanding of the nature and advantages of the present invention may be realized by reference to the latter portions of the specification and attached drawings.

DESCRIPTION OF THE SPECIFIC EMBODIMENTS

According to the present invention, a technique including a method for cleaning objects is provided. More particularly, the invention provides a technique including a method for cleaning objects using at least a combination of a high energy light source and electrostatic bias for removing impurities, such as particles and the like from integrated circuits, for example. But it will be recognized that the invention has a wider range of applicability; it can also be applied to other devices such as three-dimensional packaging of integrated semiconductor devices, photonic devices, opto-electronic devices, piezoelectronic devices, microelectromechanical systems ("MEMS"), sensors, actuators, solar cells, flat panel displays (e.g., LCD, AMLCD), biological and biomedical devices, and the like.

Figure 1:
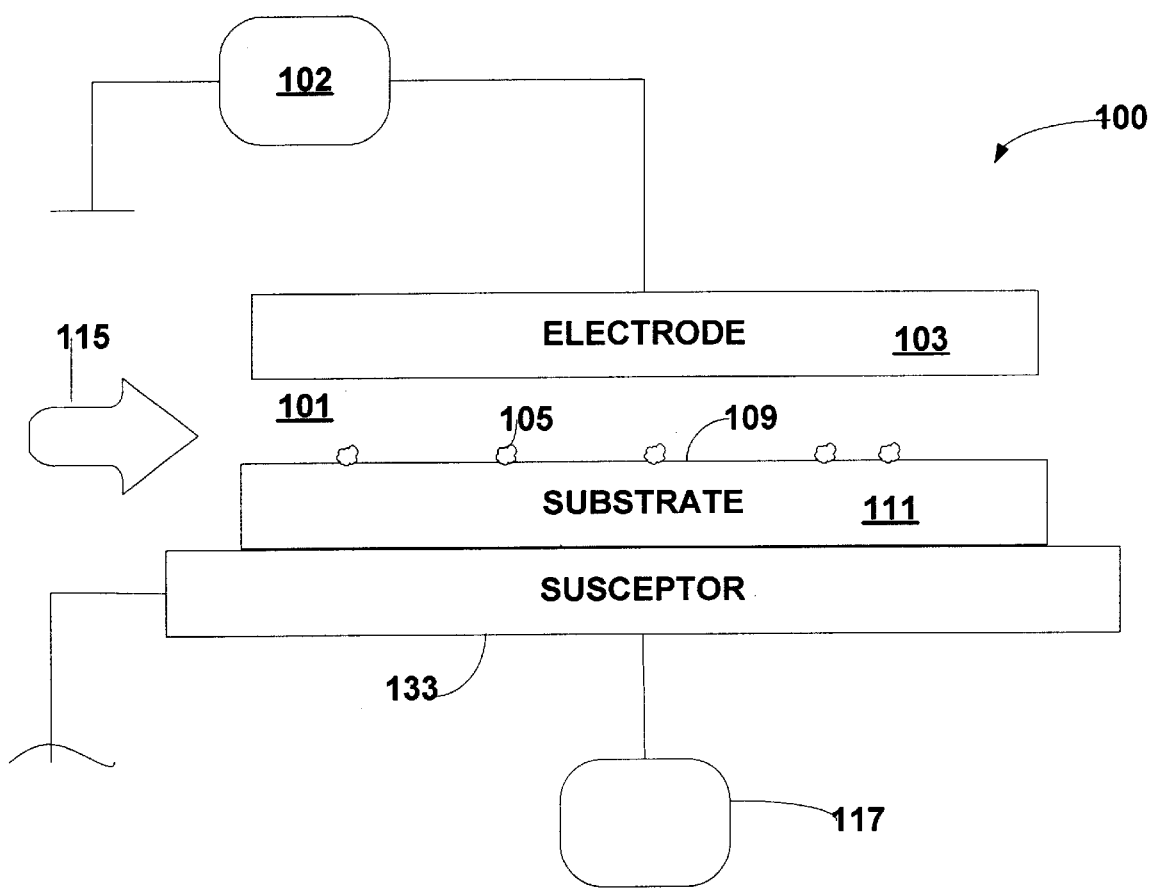
FIGS. 1–3 are simplified cross-sectional view diagrams of methods according to embodiments of the present invention.
Figure 2:
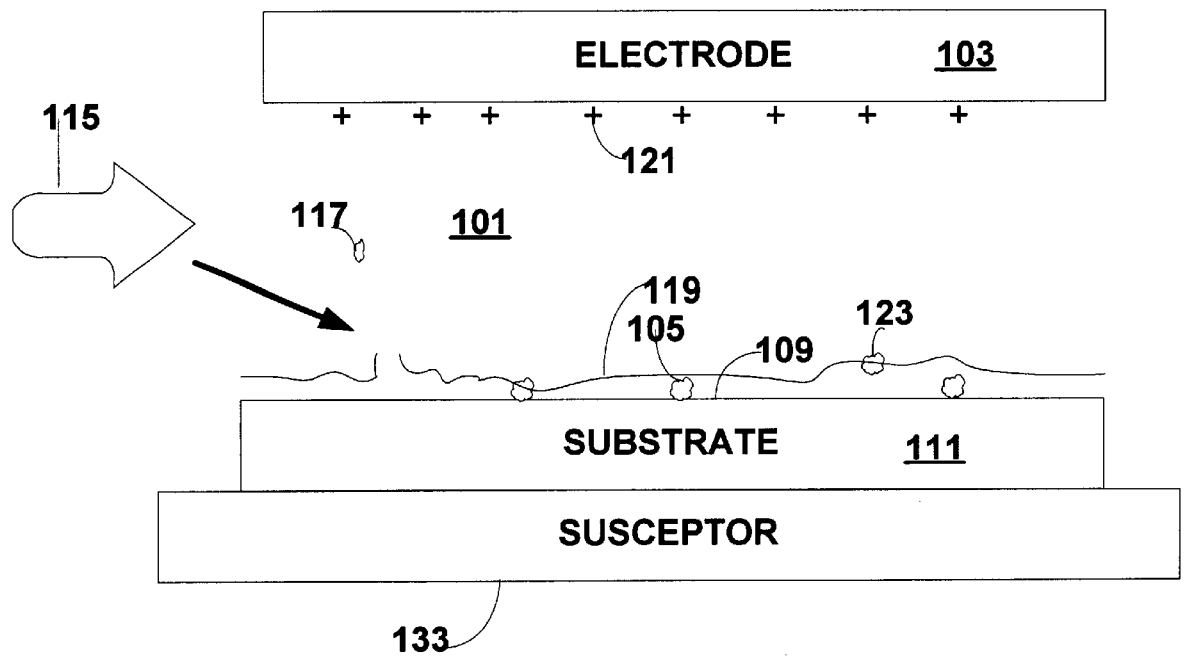
Figure 3:
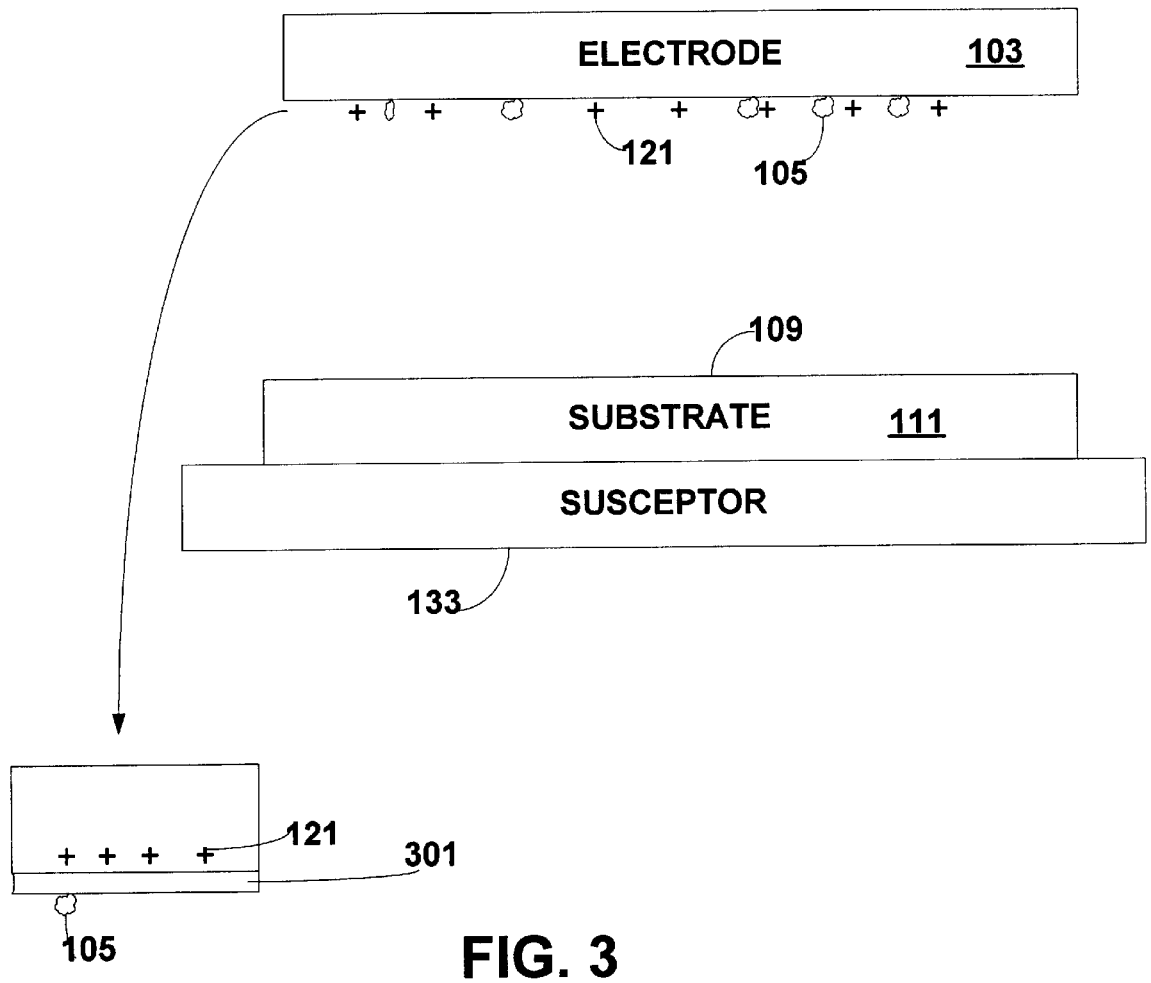

FIGS. 1–3 are simplified cross-sectional view diagrams 106 of methods according to embodiments of the present invention. These diagrams are merely examples, which should not limit the scope of the claims herein. One of ordinary skill in the art would recognize many other variations, modifications, and alternatives. As shown, the diagrams 100 include common reference numbers, which are used for cross-referencing purposes only. The diagrams include a susceptor 133, which holds substrate 111. The susceptor can include a mechanical clamp, electro-static clamp, or other attachment means. Preferably, the susceptor has an electrostatic clamp for cleanliness purposes. The substrate can be a silicon wafer, a multilayered wafer, a three-dimensional packaging of integrated semiconductor devices, substrate for photonic devices, opto-electronic device substrate, piezoelectronic device substrate, micro-electromechanical systems ("MEMS"), sensor substrate, actuator substrate, solar cell panel, flat panel display (e.g., LCD, AMLCD), biological and biomedical chip, and the like The substrate has upper surface 109. The surface can be flat or annular. The surface can be patterned or smooth. The surface has a plurality of particulate contamination 105. The particles often include a size of 1 micron and less, or 0.5 micron and less, or 0.25 micron and less, or 0.1 micron and less, or 0.05 micron and less. The upper surface faces electrode 103, which is biased using voltage source 102 to attract any released particles. The bias also creates an electric field for the particles to traverse through from the substrate to the electrode. Further details of such electrode are provided below.

In a specific embodiment, the substrate is placed under a vacuum 101, which is maintained in a chamber. The vacuum can be less than an atmosphere or can be less than a microtorr range, or less than a millitorr range. In some embodiments, the vacuum is not required. The particles face an electrode 103, which is biased using external voltage source 102. The electrode is made of a suitable material to charge it in either a positive bias or negative bias as related to particles. The bias is a static bias or can be a time varying bias depending upon the application. The electrode is preferably biased relative to the susceptor, which holds the substrate in bias. The bias creates an electric field between the susceptor and the electrode. In a specific embodiment, the particles on the surface will be directly charged or capacitively charged or a combination of both. The particles travel along the electric field lines.

The invention also includes an energy source 115 to dislodge the particles. The energy source can be any suitable means for providing a high energy light (e.g., photons) to the particles. The high energy light can include a laser, a flash lamp, and the like. The laser can be selected from an argon ion, Nd:YLF, Nd:YAG, XeCl, KrF, and ArF, and any of its harmonics or variance. Carbon dioxide can also be used in some embodiments. The energy source provides a burst, a pulse, flash, or beam of photons, which dislodge the particles from the substrate. The energy source can be applied simultaneously with the electrode bias in some embodiments.

As shown, the diagram also includes a current meter 117, which measures current that can be converted into the number of particles that have been released. The current meter can be any suitable unit that couples to the susceptor and/or electrode 103. In some embodiments, the current meter can be coupled to a controller to provide an end point detection process, which determines the time when the substrate is clean. Further details of the current meter process are described below.

Referring to FIG. 2, the high energy light source provides a photon(s) to release particle 117. The light source is adjusted with a suitable wavelength, period, and flux to release the particle. The wave length is less than one micron in some embodiments. The light source can be pulsed, varied, or flood. The particle is released from the substrate, which is often covered with a boundary layer 119, which holds the particles in place. As shown, once the particle has been released, an electrostatic force moves the particle toward the electrode. In the present embodiment, the force is a positive bias 121. The source of photons Also release other particles from the surface of the substrate as shown. The photons continue to release the particles and are attracted toward the electrode, which trap the particles, as shown in FIG. 3. The particle generally travels along the electric field lines between the substrate and the electrode. In a specific embodiment, the electrode can be covered with a material to enhance attraction and trapping of the particles. In a preferred embodiment, the electrode surface is covered with a dielectric material 301, which holds the particles firmly in place, as also shown by the FIGS. 2 and 3. Here, the particles generally do not and cannot be released back to the surface of the substrate in some embodiments during the cleaning process. Further details of these FIG. 2 can be illustrated in the energy diagram shown below.

Although the above configuration has been shown using a specific configuration between the electrode, light source, and substrate, many other configurations can also exist. For example, the electrode and light source can be combined together in a configuration to scan the light across the substrate to release any particles, while the electrode also scans across the substrate to attract and permanently remove the particles from the substrate. The electrode can also be fixed. Alternatively, the electrode can be scanned while the light source is fixed. One of ordinary skill in the art would recognize many other variations, modifications, and alternatives.

Figure 4:
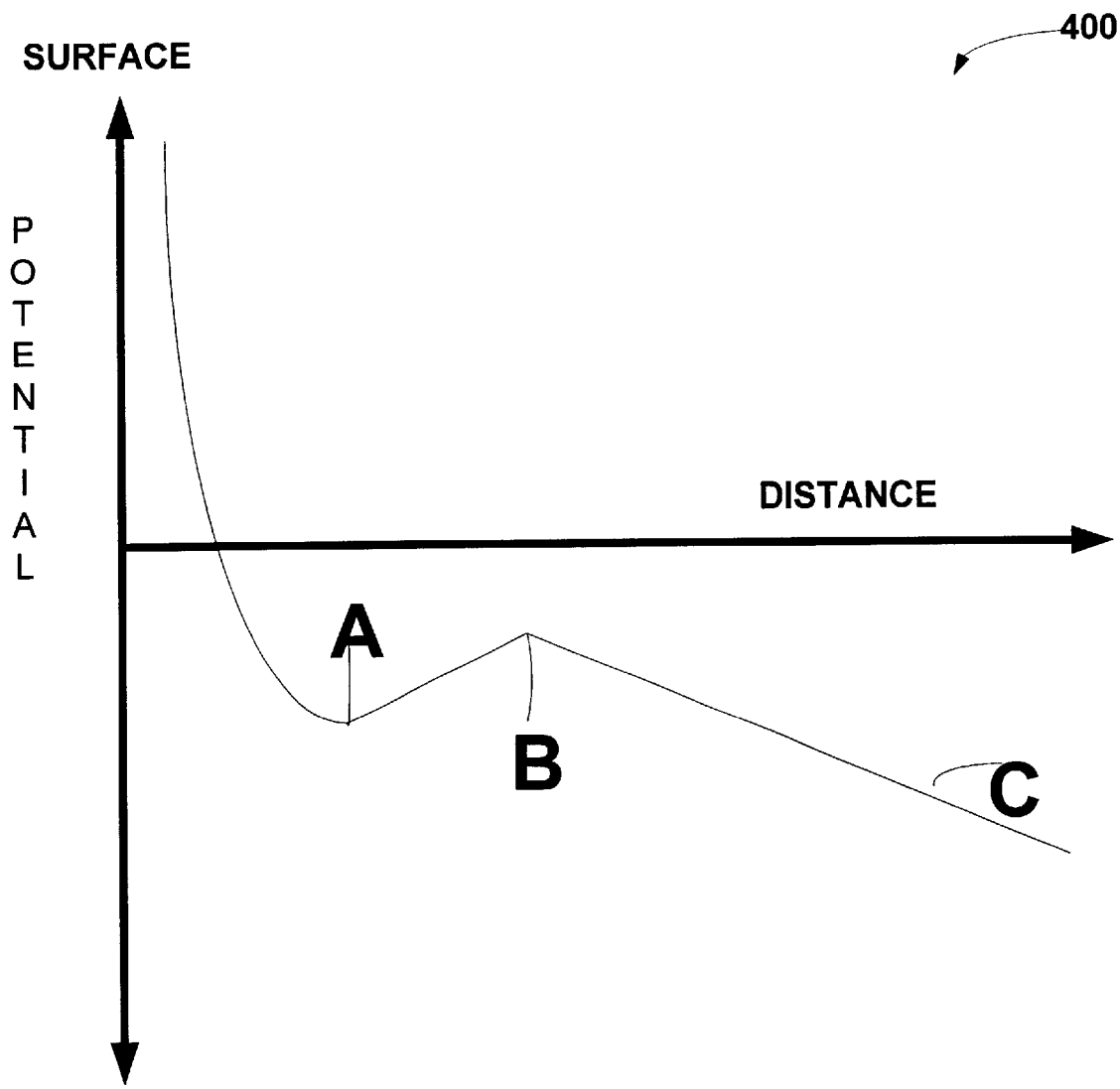
FIG. 4 is a simplified cross-sectional view diagram of potential plotted against distance according to an embodiment of the invention.

FIG. 4 is a simplified cross-sectional view diagram 400 of a energy potential plotted against distance according to an embodiment of the invention. This diagram is merely an example, which should not limit the scope of the claims herein. One of ordinary skill in the art would recognize many other variations, modifications, and alternatives. As shown, the diagram plots an energy potential against distance, which begins at the surface of the substrate. Here, the vertical axis represents energy potential, and the horizontal axis represents distance. The intersection between the vertical axis and the horizontal axis represents the surface of the substrate, where the distance extends out toward the electrode in a normal manner relative to the surface of the substrate.

An energy potential curve is shown in the plot. The plot has a high potential region near the surface, where the force between the particle and the surface actually become repulsive as the particle presses into the surface. Next to the surface of the substrate, the potential goes to infinity, ideally. The potential decreases until point A is reached, where the potential is predominantly attractive between the particle and the surface. In a specific embodiment, the attraction may include Van der Walls forces or the like. Referring to FIG. 2, for example, the relative minimum value is represented by particle 105, which is also shown in FIG. 4 as point A. Particle 105 represents an equilibrium point where the particle sticks to the surface from attractive forces between the particle and the surface. As the particle pulls away from the surface and tries to escape the boundary region, the particle (shown at point B) becomes attracted back toward the surface again, which represents a second relative minimum point. Here, particle 123 in the FIG. 2 illustrates such a particle. As shown, the attractive force at point B shows a higher potential than the particle at point A. In a preferred embodiment, the particle is released from the surface using a high energy light source, such as the one noted above, when the particle is at point A or point B. Once the particle escapes the boundary region, the particle is represented by point C in the FIG. 4. Here, the particle is also shown by particle 117 in FIG. 2. The particle is released from the boundary layer and traverses toward the electrode, which attracts and holds the particle onto the electrode. Once the particle has been attached to the electrode, it is not free to reattach to the substrate. The above is merely an illustration on how I believe the mechanism of the invention is achieved. There can be many modifications, alternatives, and variations, which should not be limited except for by the claims herein.

In a specific embodiment, the invention can also provide a convection source 155 to add a convection force to the particle to facilitate detachment of the particle. The convection source can include a heat source, a gas source, an inert particle (non contaminating) source, a fluid source, any combination of these, and the like. In one embodiment, the convection force can be applied to the surface of the substrate in a laminar manner relative to the surface, where the particles are detached from the substrate and traverse through the flow lines and electric field lines. Here, the convection force is applied simultaneously with the photons from the energy source. Alternatively, the convection force can be applied during a portion of time that the photons are applied to the surface. Alternatively, the convection force can be applied after the photons are applied to the surface. It would be recognized that there can be many other variations, modifications, and alternatives. Still further the convection force can be applied with the electric field. Here, the convection force can be applied simultaneously with the electric field, or during a portion of time that the electric field is applied, or other variations. Details of such electric field are provided more particularly below.

Figure 5:
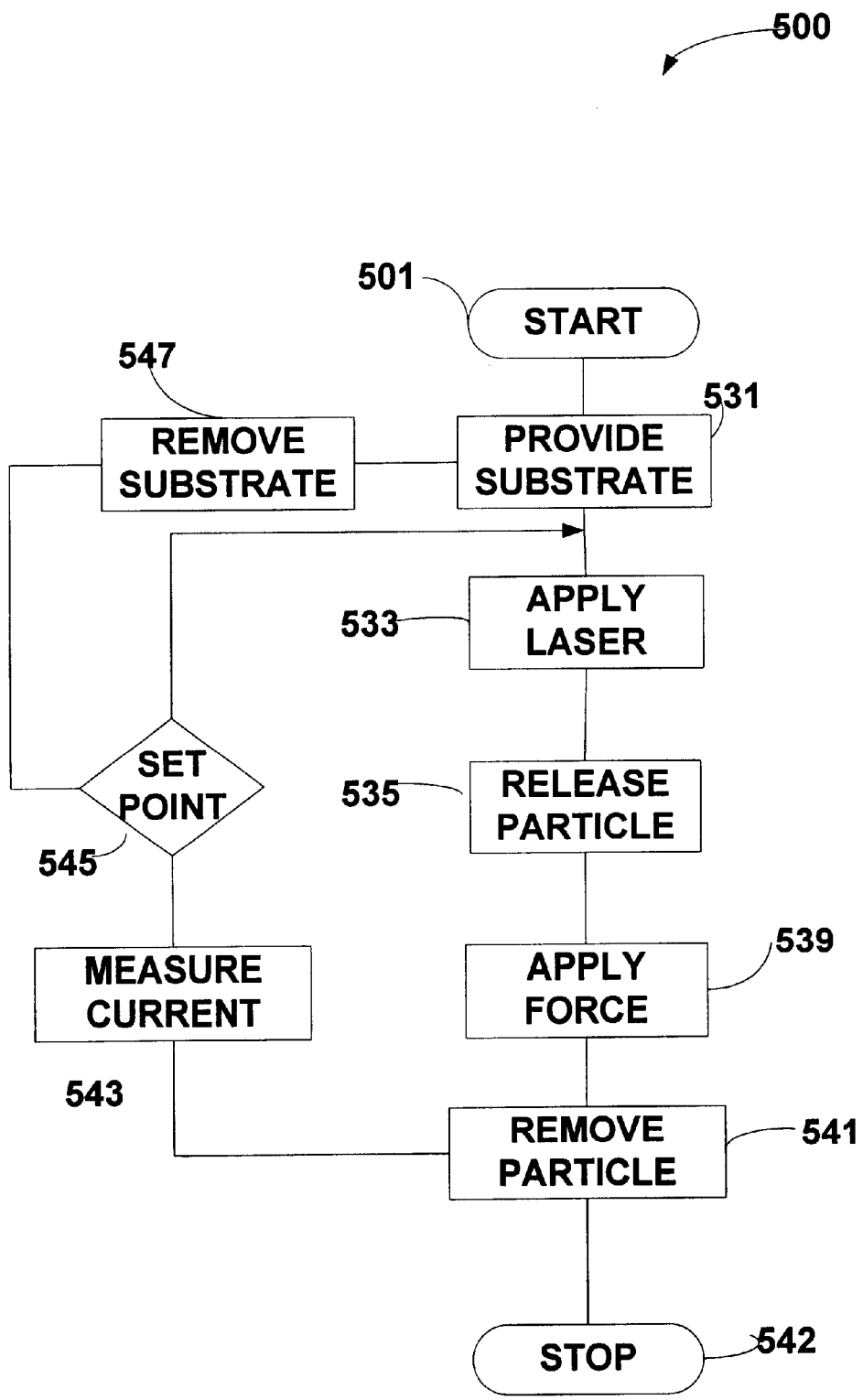
FIG. 5 is a simplified flow diagram of a method according to an embodiment of the present invention.

FIG. 5 is a simplified flow diagram 500 of a method according to an embodiment of the present invention. This diagram is merely an example, which should not limit the scope of the claims herein. One of ordinary skill in the art would recognize many other variations, modifications, and alternatives. As shown, the method begins with start, step 531. In a specific embodiment, the method provides a substrate into a cleaning tool, which includes a chamber, a susceptor, and other elements noted above. The cleaning tool is described in one of the applications noted above, which has been incorporated by reference. The susceptor can include a mechanical clamp, electro-static clamp, or other attachment means. Preferably, the susceptor has an electrostatic clamp for cleanliness purposes. The substrate can be a silicon wafer, a multilayered wafer, a three-dimensional packaging of integrated semiconductor devices, substrate for photonic devices, opto-electronic device substrate, piezoelectronic device substrate, microelectromechanical systems ("MEMS"), sensor substrate, actuator substrate, solar cell panel, flat panel display (e.g., LCD, AMLCD), biological and biomedical chip, and the like.

In a specific embodiment, the substrate has an upper surface. The surface can be flat or annular. The surface can be patterned or smooth. The surface has a plurality of particulate contamination. The particles often include a size of 1 micron and less, or 0.5 micron and less, or 0.25 micron and less, or 0.1 micron and less, or 0.05 micron and less. The substrate is placed in a chamber, which is pumped down to form a vacuum in some embodiments. The vacuum can be less than an atmosphere or can be less than a microtorr range, or less than a millitorr range. In some embodiments, vacuum is not required. The surface of the substrate including particles face an electrode, which is biased using an external voltage source. The electrode is made of a suitable material to charge it in either a positive bias or negative bias as related to particles. The bias is a static bias or can be a time varying bias depending upon the application. The electrode is preferably biased relative to the susceptor, which holds the substrate in bias.

The method goes to step 533 which applies an energy from an energy source to dislodge the particles. The energy source can be any suitable means for providing a high energy light (e.g., photons) to the particles. The high energy light can include a laser, a flash lamp, and the like. The laser can be selected from an argon ion, Nd:YLF, Nd:YAG, XeCl, KrF, and ArF, and any of its harmonics or variance. The energy source provides a burst, a pulse, flash, or beam of photons, which dislodge the particles from the substrate. In a specific embodiment, the method is substantially free from the use of an electron gun, which may charge the particle. Alternatively, the invention can be used with an electron gun to charge the particle.

In a specific embodiment, the method can also provide a convection source to add a convection force to the particle to facilitate detachment of the particle. The convection source can include a heat source, a gas source, an inert particle (non contaminating) source, a fluid source, any combination of these, and the like. In one embodiment, the convection force can be applied to the surface of the substrate in a laminar manner relative to the surface, where the particles are detached from the substrate and traverse through the flow lines and electric field lines. Here, the convection force is applied simultaneously with the photons from the energy source. Alternatively, the conductive force can be applied during a portion of time that the photons are applied to the surface. Alternatively, the conductive force can be applied after the photons are applied to the surface. It would be recognized that there can be many other variations, modifications, and alternatives. Still further the convection force can be applied with the electric field. Here, the convection force can be applied simultaneously with the electric field, or during a portion of time that the electric field is applied, or other variations. Details of such electric field are provided more particularly below.

The method releases the particle from the surface, step 535. In one embodiment, it is believed that the particle is detached from the surface of the substrate and then is freed from a boundary layer, which covers the surface of the substrate, including the particle. The particle is released from the boundary layer to become free from it. The method applies a force (step 539) between the substrate and the electrode. The force can be an electro-static force on the electrode, which attracts the particle toward the electrode along electric field lines generated between the electrode and the substrate. The electrode holds the particle in place once the particle reaches the surface of the electrode. Once the particle has been attached to the electrode, it is permanently removed from the substrate, step 541, during the process. The particle also generally cannot reattach itself back onto the substrate, which is common using conventional techniques.

In a specific embodiment, the method also uses a current meter, which measures (step 543) a current, which translates into the number of particles that have been released. The current meter can be any suitable unit that couples to the susceptor and/or electrode. The current meter measures the current, until a desired set point a reached, step 545. Once the set point has been reached, the method continues to the next step. In a preferred embodiment, the desired set point is a zero or no current condition. Here, no particles are being removed at this current condition. Alternatively, the method continues via an alternative branch and goes through the steps again until the set point has been reached. The method stops at step 542.

Figure 6:
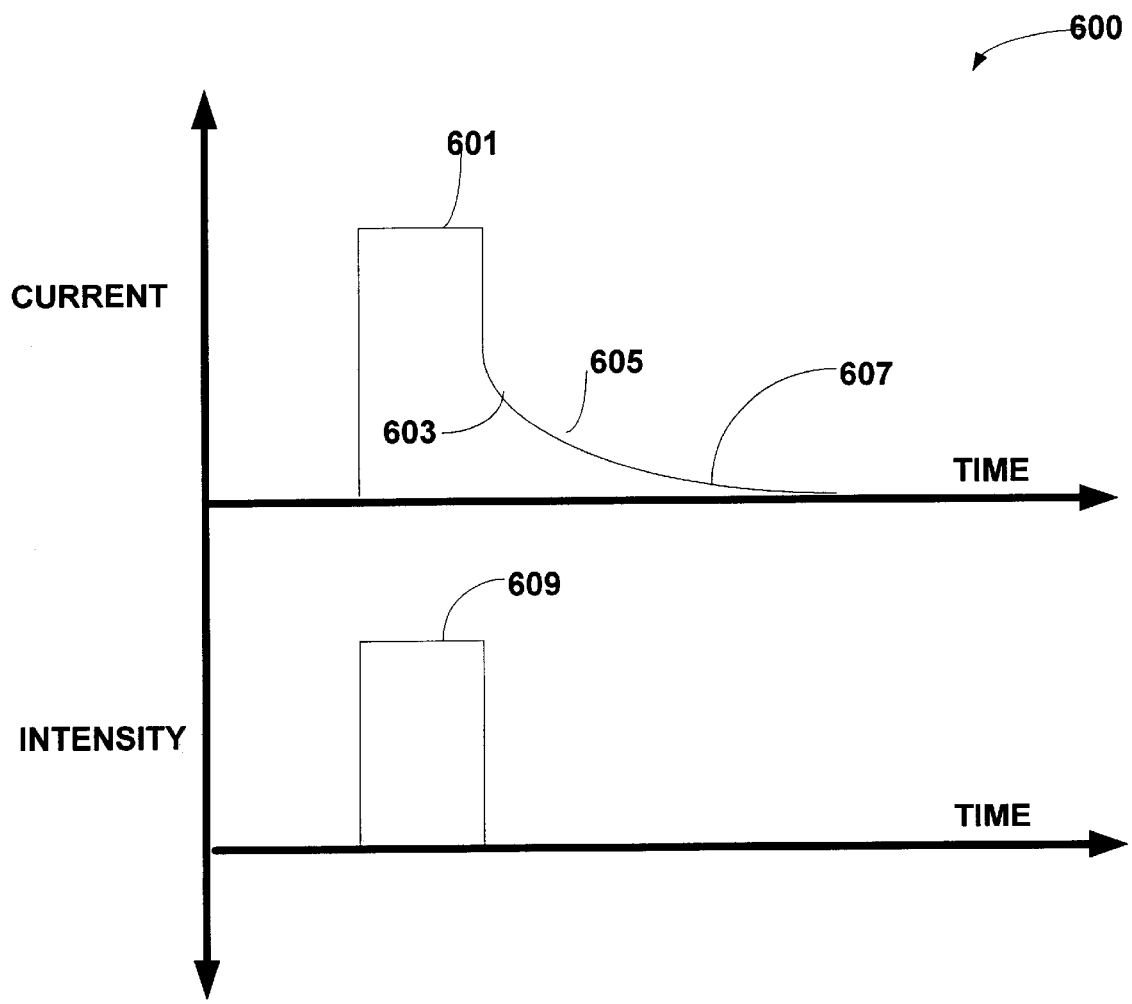
FIG. 6 is a simplified diagram of a current profile according to an embodiment of the present invention.

As merely an example, FIG. 6 is a simplified diagram 600 of a current profile according to an embodiment of the present invention. This diagram is merely an example, which should not limit the scope of the claims herein. One of ordinary skill in the art would recognize many other variations, modifications, and alternatives. As shown, the horizontal axis represents time, which extends from the vertical axis. The upper vertical axis represents current and the lower vertical axis represents intensity, where the time axis is common to each of them. As shown, the diagram of intensity shows a pulse of light 609, which is applied from the source to the surface of the substrate. The pulse can be shaped as a rectangle, for example. A current profile 601 is measured, where a pulse 601 of current extends along an edge 603, which decreases along region 605 to 607 of the profile. I believe that smaller mass particles will be removed in region 603, which has a larger current than region 605, but smaller than region 601. Charged or larger mass particles will be removed in region 605, which shows a larger current than region 607, but smaller than region 603. Region 607 will be indicative of larger mass particles. This diagram is merely an illustration, which should not limit the claims herein.

Although the above has been described in terms of a specific sequence of steps, it would be recognized that many variations could exist. For example, any of the above steps can be combined or even further separated. Some of the steps could also be exchanged for others. Additionally, the current monitoring process can be made in-situ or during the steps of applying the laser, releasing the particle, applying the force, and removing the particle, or without some of these steps. One of ordinary skill in the art would recognize many variations, alternatives, and modifications. The aforementioned steps can be implemented on the system using computer code, which can be programmed into memory of a controller system.

Figure 7:
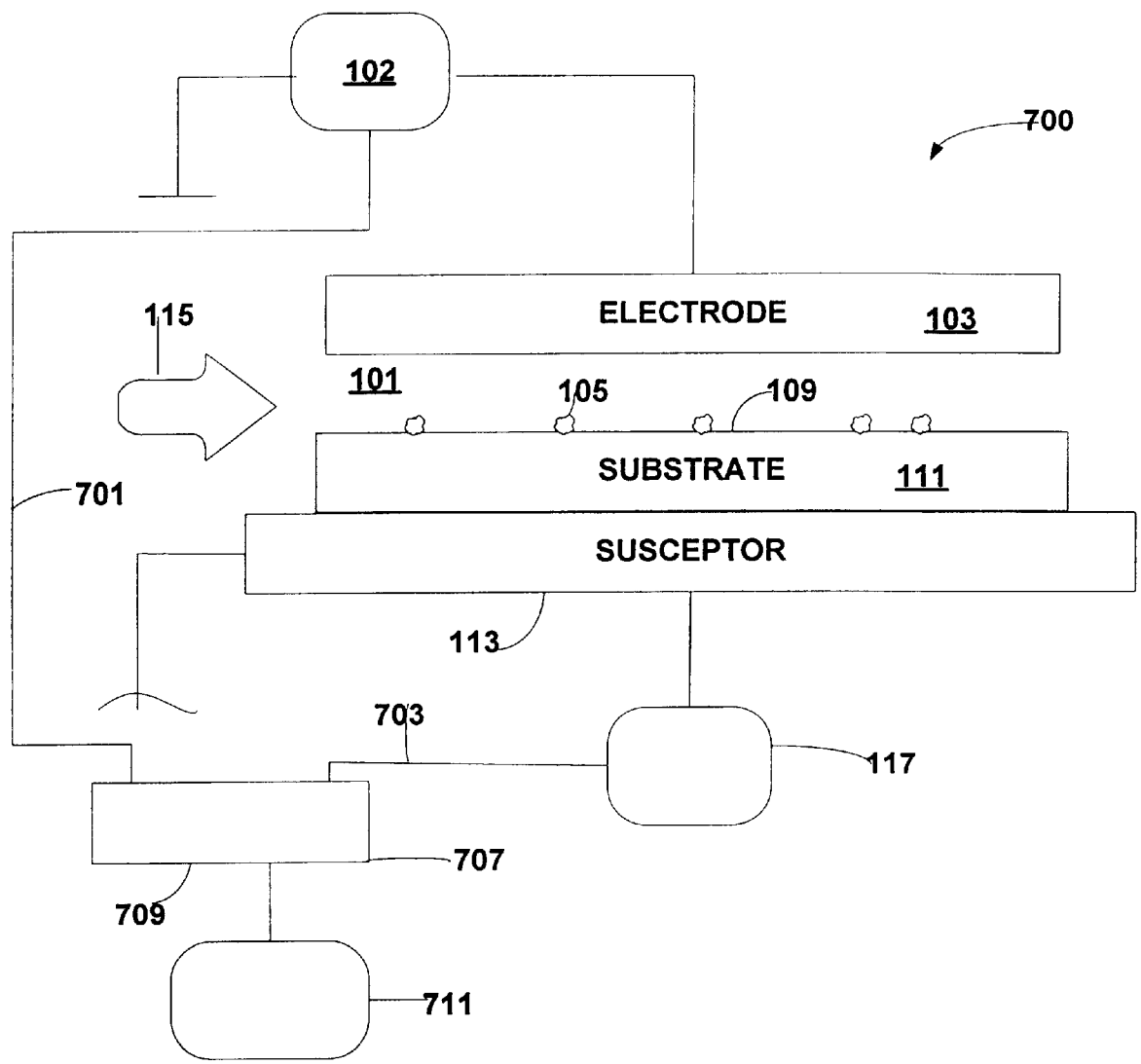
FIG. 7 is a simplified diagram of a method according to an alternative embodiment of the present invention.

FIG. 7 is a simplified diagram of a method 700 according to an embodiment of the present invention. This diagram is merely an example, which should not limit the scope of the claims herein. One of ordinary skill in the art would recognize many other variations, modifications, and alternatives. As shown, the diagrams 700 include common reference numbers, which are used for cross-referencing purposes only. The diagrams include a susceptor 133, which holds substrate 111. The susceptor can include a mechanical clamp, electro-static clamp, or other attachment means. Preferably, the susceptor has an electrostatic clamp for cleanliness purposes. The substrate can be a silicon wafer, a multilayered wafer, a three-dimensional packaging of integrated semiconductor devices, substrate for photonic devices, opto-electronic device substrate, piezoelectronic device substrate, microelectromechanical systems ("MEMS"), sensor substrate, actuator substrate, solar cell panel, flat panel display (e.g., LCD, AMLCD), biological and biomedical chip, and the like. Further details of such substrate and process are provided more particularly below:

The substrate has upper surface 109. The surface can be flat or annular. The surface can be patterned or smooth. The surface has a plurality of particulate contamination 105. The particles often include a size of 1 micron and less, or 0.5 micron and less, or 0.25 micron and less, or 0.1 micron and less, or 0.05 micron and less. The upper surface faces electrode 103, which is biased using voltage source 102 to attract any released particles. The bias also creates an electric field for the particles to traverse through from the substrate to the electrode. Further details of such electrode are provided below.

In a specific embodiment, the substrate is placed under a vacuum 101, which is maintained in a chamber. The vacuum can be less than an atmosphere or can be less than a microtorr range, or less than a millitorr range. In some embodiments, the vacuum is not required. The particles face an electrode 103, which is biased using external voltage source 102. The electrode is made of a suitable material to charge it in either a positive bias or negative bias as related to particles. The bias is a static bias or can be a time varying bias depending upon the application. The electrode is preferably biased relative to the susceptor, which holds the substrate in bias. The bias creates an electric field between the susceptor and the electrode. In a specific embodiment, the particles on the surface will be directly charged or capacitively charged or a combination of both. The particles travel along the electric field lines.

The invention also includes an energy source 115 to dislodge the particles. The energy source can be any suitable means for providing a high energy light (e.g., photons) to the particles. The high energy light can include a laser, a flash lamp, and the like. The laser can be selected from an argon ion, Nd:YLF, Nd:YAG, XeCl, KrF, and ArF, and any of its harmonics or variance. Carbon dioxide can also be used in some embodiments. The energy source provides a burst, a pulse, flash, or beam of photons, which dislodge the particles. from the substrate. The energy source can be applied simultaneously with the electrode bias in some embodiments.

As shown, the diagram also includes a current meter 117, which measures current that can be converted into the number of particles that have been released. The current meter can be any suitable unit that couples to the susceptor and/or electrode 103. In some embodiments, the current meter can be coupled to a controller 711 to provide an end point detection process, which determines the time when the substrate is clean. The controller 711 couples to I/O module 707. The module couples to controller 711, as shown, which couples to the current meter. The controller also couples to module, which couples to the electrode. The controller also couples to energy source that emits the high energy photon or photons. The controller also interfaces through the module to each of the elements in the system. The controller also has a display and user interface device, e.g., graphic, keyboard. Further details of such controller are provided below.

Although the above has been described in terms of specific hardware features, it would be recognized that there can be many alternatives, variations, and modifications. For example, any of the above elements can be separated or combined. Alternatively, some of the elements can be implemented in software or a combination of hardware and software. Alternatively, the above elements can be further integrated in hardware or software or hardware and software or the like. It is also understood that the examples and embodiments described herein are for illustrative purposes only and that various modifications or changes in light thereof will be suggested to persons skilled in the art and are to be included within the spirit and purview of this application and scope of the appended claims.

Figure 8:
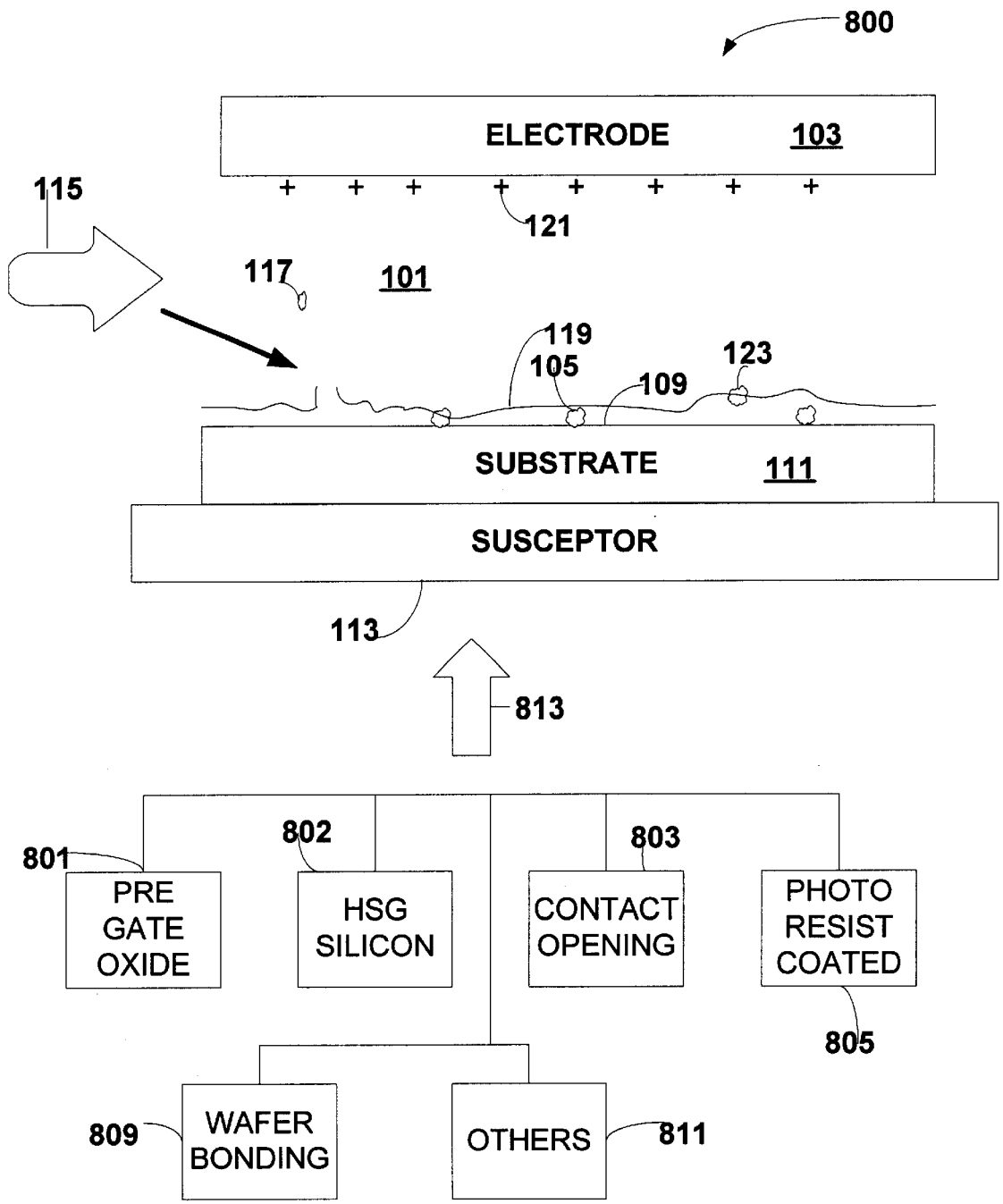
FIGS. 8–9 is a simplified diagram of a method according to an alternative embodiment of the present invention

FIG. 8 is a simplified diagram of a method 800 according to an embodiment of the present invention. This diagram is merely an example, which should not limit the scope of the claims herein. One of ordinary skill in the art would recognize many other variations, modifications, and alternatives. As shown, the diagram 800 include common reference numbers, which are used for cross-referencing purposes only. The diagrams include a susceptor 133, which holds substrate 111. The susceptor can include a mechanical clamp, electro-static clamp, or other attachment means. Preferably, the susceptor has an electrostatic clamp for cleanliness purposes. The substrate can be a silicon wafer, a multilayered wafer, a three-dimensional packaging of integrated semiconductor devices, substrate for photonic devices, opto-electronic device substrate, piezoelectronic device substrate, microelectromechanical systems ("MEMS"), sensor substrate, actuator substrate, solar cell panel, flat panel display (e.g., LCD, AMLCD), biological and biomedical chip, and the like.

The substrate has upper surface 109. The surface can be flat or annular. The surface can be patterned or smooth. The surface has a plurality of particulate contamination 105. The particles often include a size of 1 micron and less, or 0.5 micron and less, or 0.25 micron and less, or 0.1 micron and less, or 0.05 micron and less. The upper surface faces electrode 103, which is biased using voltage source 102 to attract any released particles. The bias also creates an electric field for the particles to traverse through from the substrate to the electrode.

In a specific embodiment, the substrate is placed under a vacuum 101, which is maintained in a chamber. The vacuum can be less than an atmosphere or can be less than a microtorr range, or less than a millitorr range. In some embodiments, the vacuum is not required. The particles face an electrode 103, which is biased using external voltage source 102. The electrode is made of a suitable material to charge it in either a positive bias or negative bias as related to particles. The bias is a static bias or can be a time varying bias depending upon the application. The electrode is preferably biased relative to the susceptor, which holds the substrate in bias. The bias creates an electric field between the susceptor and the electrode. In a specific embodiment, the particles on the surface will be directly charged or capacitively charged or a combination of both. The particles travel along the electric field lines.

The invention also includes an energy source 115 to dislodge the particles. The energy source can be any suitable means for providing a high energy light (e.g., photons) to the particles. The high energy light can include a laser, a flash lamp, and the like. The laser can be selected from an argon ion, Nd:YLF, Nd:YAG, XeCl, KrF, and ArF, and any of its harmonics or variance. Carbon dioxide can also be used in some embodiments. The energy source provides a burst, a pulse, flash, or beam of photons, which dislodge the particles. from the substrate. The energy source can be applied simultaneously with the electrode bias in some embodiments.

The high energy light source provides a photon(s) to release particle 117. The light source is adjusted with a suitable wavelength, period, and flux to release the particle. The wave length is less than one micron in some embodiments. The light source can be pulsed, varied, or flood. The particle is released from the substrate, which is often covered with a boundary layer 119, which holds the particles in place. As shown, once the particle has been released, an electrostatic force moves the particle toward the electrode. In the present embodiment, the force is a positive bias 121. The source of photons also release other particles from the surface of the substrate. A particle 123 that has been released by the surface but is still under the boundary layer is shown. The photons continue to release the particles and are attracted toward the electrode, which trap the particles. The particle generally travels along the electric field lines between the substrate and the electrode. In a specific embodiment, the electrode can be covered with a material to enhance attraction and trapping of the particles. In a preferred embodiment, the electrode surface is covered with a dielectric material, which holds the particles firmly in place. Here, the particles generally do not and cannot be released back to the surface of the substrate in some embodiments during the cleaning process.

The substrate can be a partially completed wafer in the manufacture of integrated circuits. Here, the substrate can be subject to the present cleaning process in combination with the processes shown. The processes can include, among others, a pre gate oxide deposition clean 801, a hemispherical grain silicon deposition (pre and post) clean 802, a contact opening clean 803, a photoresist clean 805 (pre and post), a pre wafer bonding clean 809 for a donor and/ or handle wafer, which will be bonded to each other, and others 811. Each of these processes, among others, generally require highly clean substrates, which are essentially free from particulate contamination greater than about 0.05 micron in dimension in some embodiments. The present invention helps achieve these benefits, among others, in these embodiments. Other processes are described in Silicon Processing for the VLSI Era, Lattice Press, Volume 1, Second Edition, S. Wolf and R. N. Tauber, which is incorporated by reference herein.

Although the above has been described in terms of a specific sequence of steps, it would be recognized that many variations could exist. For example, any of the above steps can be combined or even further separated. Some of the steps could also be exchanged for others. One of ordinary skill in the art would recognize many variations, alternatives, and modifications. The aforementioned steps can be implemented on the system using computer code, which can be programmed into memory of a controller system.

Figure 9:
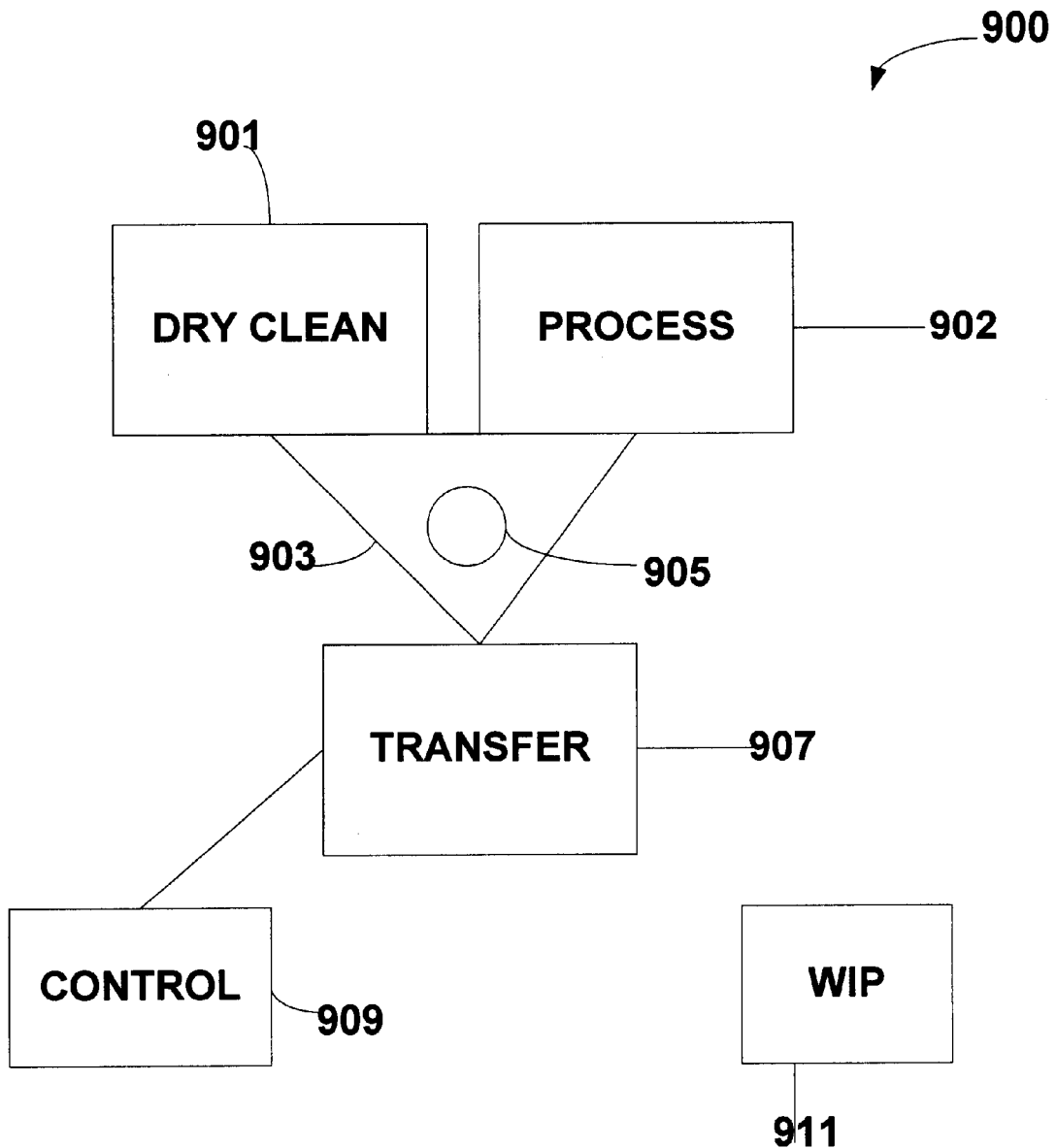

FIG. 9 is a simplified diagram of a method 900 according to an embodiment of the present invention. This diagram is merely an example, which should not limit the scope of the claims herein. One of ordinary skill in the art would recognize many other variations, modifications, and alternatives. As shown, the method includes a plurality of partially completed substrates, as work in process ("WIP") 911. These substrates, which are often in cassettes, are transferred into a transfer chamber 907, which coupled to a clustertool system. The transfer chamber is pumped down or isolated from the environment. A robot arm 905, which is positioned in an intermediary chamber, moves one of the substrates from the cassette to the present dry cleaning system 901. Further details of the dry cleaning system are provided in the applications, commonly assigned, and noted above. The system, which is in a chamber configuration, couples to the intermediary chamber. The substrate is cleaned.

Next, the substrate is removed from the cleaning chamber and transferred into the processing chamber 902. The processing chamber can be a variety of processes, such as deposition, etching, sputtering, implantation, bonding, and the like. Such process chamber generally uses the ultra cleaned substrate, which is free from particulates. Alternatively, the cleaned substrate can be transferred to the transfer chamber from the cleaning chamber into a SMIF pod, such as those made by Asyst Technologies, Inc., which provides a SMIF-based minienviromnent and manufacturing automation system that enable semiconductor manufacturers to protect in process wafers throughout the manufacturing process. The pod can be used for 200 mm and 300 mm products, as well as others.

Although the above has been described in terms of a specific sequence of steps, it would be recognized that many variations could exist. For example, any of the above steps can be combined or even further separated. Some of the steps could also be exchanged for others. One of ordinary skill in the art would recognize many variations, alternatives, and modifications. The aforementioned steps can be implemented on the system using computer code, which can be programmed into memory of a controller system.

While the above is a full description of the specific embodiments, various modifications, alternative constructions and equivalents may be used. Here, the invention can be used for the manufacture of highly integrated circuits such as those with design rules of 0.25 micron or 0.20 micron or 0.18 micron or 0.15 micron and less. Therefore, the above description and illustrations should not be taken as limiting the scope of the present invention which is defined by the appended claims.

What is claimed is:

1. An ultra clean method for manufacturing an integrated circuit device, the method comprising:

retrieving an in process substrate comprising one or more particles from an input chamber, the input chamber being coupled to a robot arm;

moving the substrate from the input chamber into a cleaning chamber, the cleaning chamber being coupled to the robot arm;

placing the substrate onto a susceptor in the cleaning chamber; and applying a high energy photon from a high energy photon source onto a surface of a substrate to release the one or more particles from the surface of the substrate while the substrate is maintained in the predetermined environment and applying an electrostatic force from an electrode directed to the substrate to attract the released one or more particles from the substrate to remove the one or more particles from the surface of the substrate, whereupon the electrostatic force prevents a possibility of the one or more particles from redistributing back onto the surface of the substrate;

transferring the substrate from the cleaning chamber to another chamber, the other chamber being selected from an etching chamber, a deposition chamber, a furnace, a sputtering chamber, an implantation chamber, and a bonding chamber.

2. The method of claim 1 wherein the high energy photon source is selected from the group fo laser sources, consisting of an argon ion, Nd:YLF, Nd:YAG, XeCl, KrF, ArF, and any of its harmonics or variance.

3. The method of claim 1 wherein the electrode comprises a negative voltage potential relative to the particles.

4. The method of claim 1 wherein the electrode comprises a positive voltage potential relative to the particles.

5. The method of claim 1 wherein the particles are less than about 0.1 micron in dimension or are less than about 0.05 micron in dimension.

6. The method of claim 1 wherein the predetermined environment is a vacuum environment or an atmospheric pressure environment.

7. The method of claim 1 wherein the particles are attached substantially by a Van der walls attraction to the surface.

8. The method of claim 1 wherein the high energy photon source is pulsed or flashed and substantially free from an electron gun.

9. The method of claim 1 wherein the substrate is selected from a pre gate oxide wafer, a partially completed wafer, a wafer comprising a contact opening, a donor wafer or handle wafer to be bonded to each other, and a flat panel substratate.

10. The method of claim 1 wherein the other chamber is coupled to the robot arm chamber.

11. The method of claim 1 wherein the other chamber is coupled to the robot arm through a SMIF pod.

12. The method of claim 1 wherein the electrode is maintained at a positive voltage potential relative to the particles during a first portion of time and a negative voltage potential relative to the particles during a second portion of time.

13. The method of claim 12 wherein a electrode is maintained at the first positive voltage potential or at a second positive voltage potential.

14. The method of claim 1 further comprising applying a convective force to the cleaning chamber to facilitate the release of the one or more particles.

15. The method of claim 14 wherein the convective force is provided simultaneously with the high energy dossage is partials of time photon.

16. The method of claim 14 wherein the convective force is provided after applying the high energy photon.

17. An ultra clean method for manufacturing an integrated circuit device, the method comprising:

retrieving a substrate comprising one or more particles from an input chamber, the input chamber being coupled to a robot chamber, the robot chamber including a robot arm, the robot arm being used to retrieve the substrate from the input chamber;

moving the substrate to a cleaning chamber using the robot arm, the cleaning chamber being coupled to the robot chamber;

placing the substrate onto a susceptor in the cleaning chamber; and providing at least a pulse of high energy photons to one or more particles on a surface of the substrate to release the one or more particles from the surface while the substrate is maintained an environment and simultaneously during a portion of time applying an electrostatic force to attract the released one or more particles from the substrate to permanently remove the one or more particle from the surface of the substrate; and transferring the substrate from the cleaning chamber to a second chamber.

18. The method of claim 17 further comprising applying a convective force to the one or more particles to facilitate the release of the one or more particles.

19. The method of claim 17 wherein the pulse is a single pulse or multiple pulses.

20. The method of claim 19 wherein the multiple pulses a flood of high energy photons.

* * * * *